United States Patent
Ito et al.

(10) Patent No.: US 10,855,172 B2
(45) Date of Patent: Dec. 1, 2020

(54) SHIELD, ELECTRONIC CIRCUIT, AND DC-DC CONVERTER

(71) Applicant: Murata Manufacturing Co., Ltd., Kyoto-fu (JP)

(72) Inventors: Kenichi Ito, Nagaokakyo (JP); Shun Takai, Nagaokakyo (JP); Koichi Yamaguchi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 331 days.

(21) Appl. No.: 15/833,208

(22) Filed: Dec. 6, 2017

(65) Prior Publication Data

US 2018/0166980 A1 Jun. 14, 2018

(30) Foreign Application Priority Data

Dec. 9, 2016 (JP) .................................. 2016-239309

(51) Int. Cl.
| | |
|---|---|
| *H02M 1/44* | (2007.01) |
| *H02M 3/06* | (2006.01) |
| *H02M 3/156* | (2006.01) |
| *H05K 7/14* | (2006.01) |
| *H05K 9/00* | (2006.01) |
| *H01F 27/36* | (2006.01) |

(Continued)

(52) U.S. Cl.
CPC .............. *H02M 1/44* (2013.01); *H01F 27/36* (2013.01); *H02M 3/06* (2013.01); *H02M 3/156* (2013.01); *H05K 7/1432* (2013.01); *H05K 9/0026* (2013.01); *H02M 3/1584* (2013.01); *H02M 2001/0064* (2013.01); *Y02B 70/10* (2013.01)

(58) Field of Classification Search
CPC .......... H02M 1/44; H02M 3/156; H02M 3/06; H02M 3/1584; H02M 2001/0064; H01F 27/362; H05K 7/1432; H05K 9/0026; H05K 9/0024; Y02B 70/1425
USPC ........................................................... 361/15
See application file for complete search history.

(56) References Cited

FOREIGN PATENT DOCUMENTS

| | | |
|---|---|---|
| JP | S51-049817 U | 4/1976 |
| JP | S5331378 Y2 | 8/1978 |
| JP | 2002-334954 A | 11/2002 |

(Continued)

OTHER PUBLICATIONS

JP-5331378Y2; Entire specification and drawings; (Year: 1978).*

(Continued)

*Primary Examiner* — Dharti H Patel
(74) *Attorney, Agent, or Firm* — Studebaker & Brackett PC

(57) ABSTRACT

A shield includes an inductor that includes outer electrodes and that is mounted on a substrate in or on which a wiring pattern is formed, a second capacitor that is electrically connected between one of the outer electrodes of the inductor and a ground pattern formed in or on the substrate, and a shield member that is disposed so as to cover the inductor and electrically connected to the one of the outer electrodes of the inductor, to which the second capacitor is connected. The second capacitor has frequency characteristics such that, when the self-resonance frequency of the second capacitor serves as a boundary, the impedance of the second capacitor decreases as the frequency increases on the low frequency side and that the impedance of the second capacitor increases as the frequency increases on the high frequency side.

15 Claims, 9 Drawing Sheets

(51) Int. Cl.
  *H02M 1/00* (2006.01)
  *H02M 3/158* (2006.01)

(56) References Cited

FOREIGN PATENT DOCUMENTS

JP   2003-273562 A   9/2003
JP   2009-176877 A   8/2009

OTHER PUBLICATIONS

KR-2005-0000688; Park; Jan. 6, 2005; Title: DC to DC converter module with inductor and substrate integrated with eath other; (Year: 2005).*
JP-5331378-Y2; Entire specification drawings.*
KR-2005-0000688, Jan. 6, 2005.*
An Office Action mailed by the Chinese Patent Office dated Jun. 6, 2019, which corresponds to Chinese Patent Application No. 201711283709.7 and is related to U.S. Appl. No. 15/833,208 with English language translation.
An Office Action; "Notification of Reasons for Refusal," mailed by the Japanese Patent Office dated Mar. 19, 2019, which corresponds to Japanese Patent Application No. 2016-239309 and is related to U.S. Appl. No. 15/833,208; with English language translation.

* cited by examiner

SHIELD, ELECTRONIC CIRCUIT, AND DC-DC CONVERTER

CROSS-REFERENCE TO RELATED APPLICATION

This application claims benefit of priority to Japanese Patent Application No. 2016-239309, filed Dec. 9, 2016, the entire content of which is incorporated herein by reference.

BACKGROUND

Technical Field

The present disclosure relates to a shield, an electronic circuit that includes the shield, and a DC-DC converter.

Description of the Related Art

A DC-DC converter includes, for example, a switching element, a diode, an inductor (power inductor), and a smoothing condenser and steps up or steps down an arbitrary direct-current (DC) voltage to a desired DC voltage. In the case where a DC-DC converter is used as a power-supply circuit of an electronic device of an automobile, noise that is emitted by, for example, an inductor of the DC-DC converter may sometimes become a problem in an AM radio or the like mounted in an automobile.

In order to suppress noise from being emitted by an electronic component, such as an inductor, for example, an electrically conductive shield member that surrounds an electronic component is used. Japanese Unexamined Patent Application Publication No. 2003-273562 discloses an electromagnetic-wave shield sheet that is used for covering an electric element mounted on a circuit board. The electromagnetic-wave shield sheet is formed by joining an electroconductive film and an insulating film together, and the electroconductive film is electrically connected to a ground electrode provided on a surface of the circuit board.

However, in the case of using a shield member, as in the technology disclosed in Japanese Unexamined Patent Application Publication No. 2003-273562, the shield member needs to be grounded. Consequently, it is necessary to provide a ground pattern, which is to be connected to the shield member, on a substrate. This requires a space in which the ground pattern for the shield member is to be mounted on the substrate and limits the pattern layout.

SUMMARY

The present disclosure has been made to solve the above-described problems, and it is an object of the present disclosure to provide a shield capable of ensuring an effect of suppressing noise, the effect being obtained by a shield member, without providing a ground pattern for the shield member in or on a substrate, an electronic circuit that includes the shield, and a DC-DC converter circuit.

A shield according to a preferred embodiment of the present disclosure includes a first electronic component that includes an outer electrode and that is mounted on a substrate in or on which a wiring pattern is formed, a second electronic component that is electrically connected between the outer electrode of the first electronic component and a ground pattern formed in or on the substrate, and a shield member that is disposed so as to cover the first electronic component and electrically connected to the outer electrode of the first electronic component, to which the second electronic component is connected. The second electronic component has a frequency characteristic such that an impedance of the second electronic component decreases at a predetermined frequency.

In the shield according to the preferred embodiment of the present disclosure, the shield member is disposed so as to cover the first electronic component and electrically connected to the outer electrode of the first electronic component. In addition, in the shield according to the preferred embodiment of the present disclosure, the second electronic component is electrically connected to the outer electrode of the first electronic component and the ground pattern of the substrate. Therefore, the shield member is electrically connected to the second electronic component via the outer electrode of the first electronic component. The second electronic component has the frequency characteristic such that the impedance of the second electronic component decreases at the predetermined frequency. With this configuration, when noise is generated by the first electronic component and reaches the shield member, the noise can be grounded through the second electronic component in accordance with the frequency characteristic. As a result, the noise generated by the first electronic component is blocked, and emission of the noise to the outside can be suppressed. As described above, in the shield according to the preferred embodiment of the present disclosure, the shield member does not need to be grounded, and thus, an effect of suppressing noise, the effect being obtained by the shield member, (shielding effect) can be ensured without providing a ground pattern for the shield member in or on the substrate. Note that each of the first electronic component and the second electronic component may be formed of a single electronic element or may be formed of a plurality of electronic elements.

In the shield according to the preferred embodiment of the present disclosure, it is preferable that the second electronic component have a frequency characteristic such that the impedance of the second electronic component increases at a frequency at which the second electronic component enables an electrical signal to pass through the outer electrode of the first electronic component and that the impedance of the second electronic component decreases at a frequency at which the shield member provides a shielding effect. As a result of the shield being configured in this manner, noise generated by a member to be shielded by the shield member can be effectively grounded through the second electronic component without causing the electrical signal that has passed through the outer electrode of the first electronic component to be grounded through the second electronic component.

In the shield according to the preferred embodiment of the present disclosure, it is preferable that the second electronic component have a frequency characteristic such that, when a predetermined frequency serves as a boundary, the impedance of the second electronic component decreases as a frequency increases on a low frequency side of the predetermined frequency and that the impedance of the second electronic component increases as the frequency increases on a high frequency side of the predetermined frequency. As a result of the shield being configured in this manner, the impedance of the second electronic component decreases on the low frequency side of the predetermined frequency serving as a boundary, and thus, noise can be grounded in a frequency band in which the impedance of the second electronic component decreases.

An electronic circuit according to a preferred embodiment of the present disclosure includes one of the above-described shields, and the first electronic component and the second electronic component are an inductor and a capacitor, respectively.

In the electronic circuit according to the preferred embodiment of the present disclosure, the above-described shield shields the inductor (first electronic component), and thus, an effect of suppressing noise, the effect being obtained by a shield member, can be ensured without providing a ground pattern for the shield member in or on a substrate of the electronic circuit. In particular, the capacitor, which is the second electronic component, has a frequency characteristic such that the closer the self-resonance frequency of the capacitor, the lower the impedance of the capacitor, and thus, noise can be grounded through the capacitor (second electronic component).

In the electronic circuit according to the preferred embodiment of the present disclosure, it is preferable that the inductor have a vertically wound structure and that the shield member be provided on at least a top surface of the inductor. As a result of the electronic circuit being configured in this manner, noise generated by the inductor having a vertically wound structure in the vertical direction can be effectively blocked by the shield member, and emission of noise to the outside can be suppressed.

In the electronic circuit according to the preferred embodiment of the present disclosure, it is preferable that the inductor have a transversely wound structure and that the shield member be provided on at least side surfaces of the inductor that face each other. As a result of the electronic circuit being configured in this manner, noise generated by the inductor having a transversely wound structure in the transverse direction can be effectively blocked by the shield member, and emission of noise to the outside can be suppressed.

In the electronic circuit according to the preferred embodiment of the present disclosure, it is preferable that the shield member be provided around the periphery of the entire surface of the inductor. As a result of the electronic circuit being configured in this manner, noise generated by the inductor in all directions can be blocked by the shield member, and an effect of suppressing noise that is emitted to the outside can be improved.

A DC-DC converter according to a preferred embodiment of the present disclosure includes one of the above-described shields and a switching element. The first electronic component is a power inductor that is electrically connected to the switching element, and the second electronic component is a smoothing capacitor that is electrically connected to the power inductor.

In the DC-DC converter according to the preferred embodiment of the present disclosure, the above-described shield shields the power inductor (first electronic component), and thus, an effect of suppressing noise, the effect being obtained by a shield member, can be ensured without providing a ground pattern for the shield member in or on a substrate of the DC-DC converter.

According to the present disclosure, an effect of suppressing noise, the effect being obtained by a shield member, can be ensured without providing a ground pattern for the shield member in or on a substrate.

Other features, elements, characteristics and advantages of the present disclosure will become more apparent from the following detailed description of preferred embodiments of the present disclosure with reference to the attached drawings.

DETAILED DESCRIPTION

Figure 1:
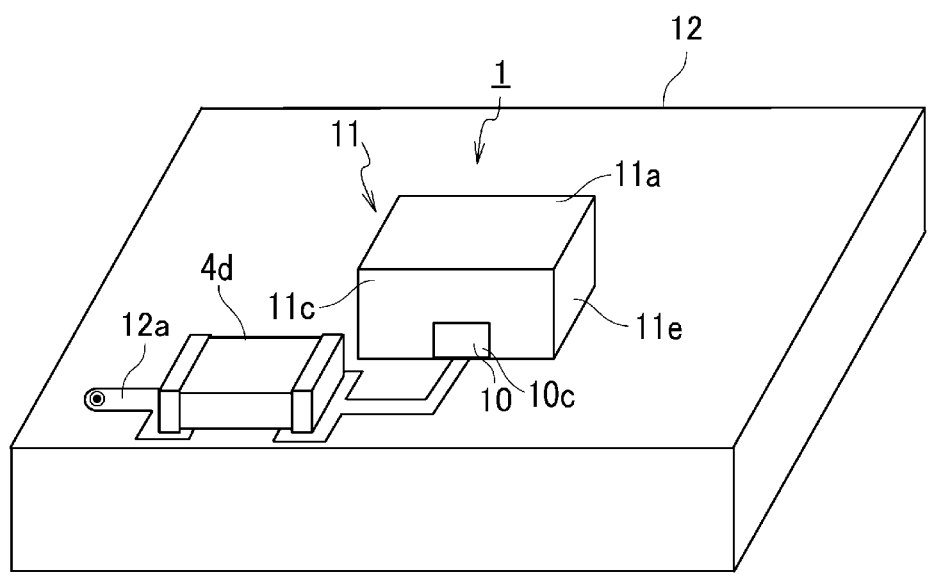
FIG. 1 is a perspective view illustrating a configuration of a shield according to a first embodiment of the present disclosure.

Preferred embodiments of the present disclosure will be described in detail below with reference to the drawings. Note that, in the drawings, portions that are the same as each other or that correspond to each other are denoted by the same reference numerals. In addition, in the drawings, the same elements are denoted by the same reference numerals, and repeated descriptions will be omitted.

In each of the embodiments, a shield according to the present disclosure is applied to a shield of an inductor (corresponding to a first electronic component described in the claims) that is mounted on a substrate of a DC-DC converter (corresponding to an electronic circuit and a DC-DC converter each described in the claims) used as a power-supply circuit of an electronic device of an automobile. Three embodiments of the present disclosure will be described below.

First Embodiment

Figure 2:
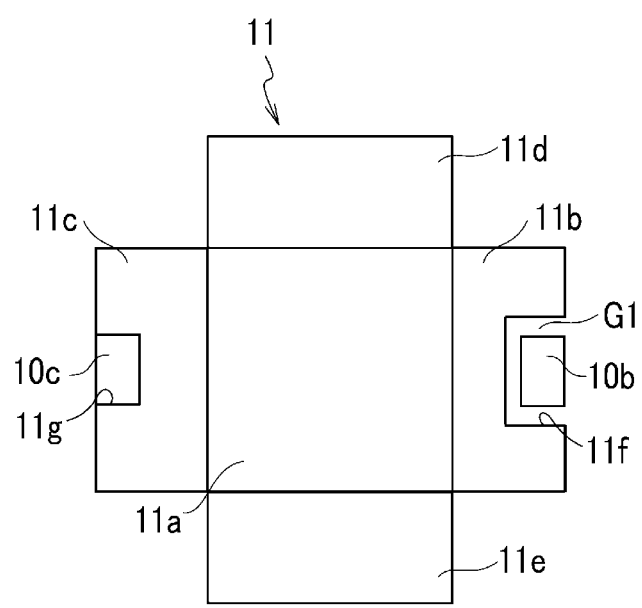
FIG. 2 is a developed view of a shield member used in the shield according to the first embodiment.
Figure 3:
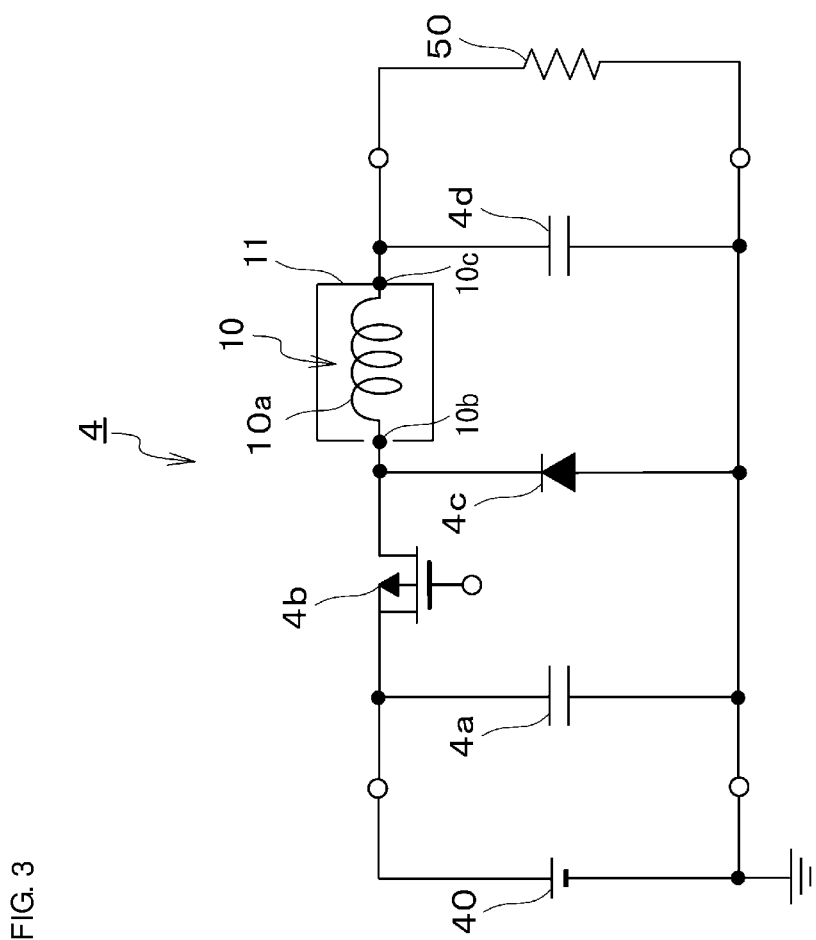
FIG. 3 is a circuit diagram of a DC-DC converter that includes the shield according to the first embodiment.

A shield 1 according to a first embodiment of the present disclosure will now be described with reference to FIG. 1 to FIG. 3. FIG. 1 is a perspective view illustrating the configuration of the shield 1 according to the first embodiment. FIG. 2 is a developed view of a shield member 11 used in the shield 1 according to the first embodiment. FIG. 3 is a circuit diagram of a DC-DC converter 4 that includes the shield 1 according to the first embodiment.

The shield 1 shields an inductor 10 of the DC-DC converter 4 by using the shield member 11 and is a circuit that suppresses noise from being emitted by the inductor 10. In particular, the shield 1 ensures an effect of suppressing noise without connecting the shield member 11 to a ground of a substrate 12. Before specifically describing the shield 1, the DC-DC converter 4 will now be described.

The DC-DC converter 4 steps down an arbitrary DC voltage input from a power supply 40 to a desired DC voltage (converts an arbitrary DC voltage input from a power supply 40 into a desired DC voltage) and outputs the stepped down voltage to an electrical load 50. The DC-DC converter 4 is used as a power-supply circuit of an electronic device of an automobile. The DC-DC converter 4 steps down a voltage of about 12 V input from the power supply 40 (a battery) to about 5 V and outputs the stepped down voltage to the electrical load 50. The DC-DC converter 4 is a chopper (switching) DC-DC converter.

As illustrated in FIG. 3, the DC-DC converter 4 includes, for example, an input first capacitor 4a, a switching element 4b, a diode 4c, the inductor 10, and an output second capacitor 4d (corresponding to a second electronic component described in the claims), and these electronic components are mounted on the substrate 12. Wiring patterns (ground pattern, power-supply pattern, and signal pattern) are formed in or on the substrate 12. A controller (not illustrated) or the like performs switching control of the switching element 4b so as to switch the switching element 4b on and off in accordance with a predetermined switching frequency. For example, a metal-oxide-semiconductor field-effect transistor (MOSFET) may preferably be used as the switching element 4b.

Operation of the DC-DC converter 4 will now be described. When the switching element 4b is switched on, a current flows through the inductor 10. In this case, the inductor 10 generates an electromotive force by self-induction so as to hinder the flowing current and thereby store energy. When the switching element 4b is switched off, the flow of the current through the inductor 10 is stopped. In this case, in order to maintain the current, the inductor 10 transfers the stored energy to the output side as current. The voltage generated by this switching operation is smoothed by the second capacitor 4d and output to the electrical load 50.

In the DC-DC converter 4, which operates as described above, the inductor 10 generates noise (electric-field noise and magnetic-field noise) in accordance with a switching operation of the switching element 4b. When the noise is emitted to the outside, for example, in the case where the DC-DC converter 4 is used in an automobile, as a result of the emitted noise propagating to a car-mounted AM radio or the like, there is a possibility of noise entering the sound from the radio. The shield 1 is provided in order to suppress the noise from being emitted to the outside by the inductor 10. The shield 1 will now be described.

The inductor 10 is a power inductor used as one of electronic components included in the DC-DC converter 4. The inductor 10 includes a core, a winding 10a wound around the core, and a pair of outer electrodes 10b and 10c. For example, a multilayer inductor may preferably be used as the inductor 10. Alternatively, a wire-wound inductor, a toroidal inductor, or the like may also be used as the inductor 10. The core is made of a magnetic material such as ferrite. The winding 10a is made of a conductor such as copper.

The pair of outer electrodes 10b and 10c are terminal electrodes used for mounting the inductor 10 onto the substrate 12. The outer electrode 10b and the outer electrode 10c are disposed so as to face each other. Each of the outer electrodes 10b and 10c is formed of a conductor. Each of the outer electrodes 10b and 10c is electrically connected to a predetermined portion of a wiring pattern formed in or on the substrate 12. The outer electrode 10b is electrically connected to a first end portion of the winding 10a. As a result of the inductor 10 being mounted on the substrate 12, the outer electrode 10b is electrically connected to a connection point between the switching element 4b and the diode 4c of the DC-DC converter 4. The electric potential at this connection point varies in accordance with the switching frequency of the switching element 4b. The outer electrode 10c is electrically connected to a second end portion of the winding 10a. As a result of the inductor 10 being mounted on the substrate 12, the outer electrode 10c is electrically connected to a first end of the second capacitor 4d of the DC-DC converter 4. The voltage at the connection point between the outer electrode 10c and the first end of the second capacitor 4d is maintained to be approximately constant by being smoothed by the second capacitor 4d and thus has a stable electric potential.

The shield member 11 is a member that blocks noise generated by the inductor 10. The shield member 11 is made of a metal (e.g., copper) and has electrical conductivity. For example, a metal plate, a metal foil, a metal-deposited film, or the like can be used as the shield member 11.

The shield member 11 is disposed so as to cover the main body of the inductor 10. The shield member 11 is provided around the periphery of at least a portion of the main body of the inductor 10 in accordance with the structure of the inductor 10, the arrangement of the components, and the like. In particular, it is preferable that the shield member 11 be provided around the periphery of the entire surface of the main body of the inductor 10 (the entire main body of the inductor 10). However, in the case where a ground pattern of the substrate 12 is disposed below the inductor 10, the shield member 11 does not need to be provided on the bottom surface of the inductor 10. The shield member 11 may be provided so as to be in close contact with a surface of the main body of the inductor 10 or may be formed in, for example, a box form and disposed with a gap between the shield member 11 and the main body.

As illustrated in FIG. 2, for example, the shield member 11 has five surfaces including a top surface 11a, a first pair of side surfaces 11b and 11c that face each other, and a second pair of side surfaces 11d and 11e that face each other. The side surface 11b and the side surface 11c are respectively disposed on the side on which the outer electrode 10b of the inductor 10 is disposed and on the side on which the outer electrode 10c of the inductor 10 is disposed. Each of the side surface 11d and the side surface 11e is positioned between the pair of side surfaces 11b and 11c. However, in the case where the ground pattern of the substrate 12 is not disposed below the inductor 10, it is preferable that the shield member 11 have six surfaces including a bottom surface thereof. In the case where the shield member 11 cannot have all six surfaces, it is preferable that the shield member 11 be provided in the following manner. In the case where the inductor 10 is a vertically-wound inductor, it is preferable that the shield member 11 have at least the top surface 11a that blocks a magnetic flux generated in the vertical direction. In the case where the inductor 10 is a transversely-wound inductor, it is preferable that the shield member 11 have at least the pair of side surfaces 11b and 11c that face each other and that block a magnetic flux generated in the transverse direction.

The side surface 11b of the shield member 11, which is located on the side on which the outer electrode 10b is disposed, has a cavity 11f that is formed so as to be larger than the outer electrode 10b, and portions of the side surface 11b except for the cavity 11f include a shield metal. The outer electrode 10b is disposed in the cavity 11f. Thus, there is a gap G1 between the outer electrode 10b and the side surface 11b of the shield member 11. In contrast, the side surface 11c of the shield member 11, which is located on the side on which the outer electrode 10c is disposed, has a cavity 11g that is formed so as to have a size approximately equal to that of the outer electrode 10c, and portions of the side surface 11c except for the cavity 11g include a shield metal. The outer electrode 10c is disposed in the cavity 11g and electrically connected to the side surface 11c. Thus, the outer electrode 10c and the shield member 11 are electrically connected to each other. Each of the remaining surfaces 11a, 11d, and 11e of the shield member 11 is provided entirely with a shield metal. Note that, in the case where the shield member 11 does not have the side surface 11c, the outer electrode 10c is electrically connected to one of the other surfaces, such as the top surface 11a.

As described above, the shield member 11 is electrically connected to the outer electrode 10c of the inductor 10. Therefore, the shield member 11 is electrically connected to the first end of the second capacitor 4d via the outer electrode 10c. As described above, the first end of the second capacitor 4d has a stable electric potential. A second end of the second capacitor 4d is electrically connected to a ground pattern 12a formed in or on the substrate 12 (the second end of the second capacitor 4d is grounded). Note that the shield member 11 is not connected to the ground of the substrate 12 (is not grounded). Accordingly, the substrate 12 is not provided with a ground pattern for the shield member 11.

Note that an insulating member having an insulating property may be provided between the main body of the inductor 10 and the shield member 11. As the insulating member, for example, an insulating sheet, an insulating film, an insulating resin, or the like can be used.

Operation of the shield 1 will now be described. During the period when the DC-DC converter 4 is operating, the inductor 10 generates noise. The electrically conductive shield member 11 is disposed around the periphery of the inductor 10. The shield member 11 is electrically connected to the first end of the second capacitor 4d via the outer electrode 10c of the inductor 10.

A capacitor has frequency characteristics (e.g., substantially V-shaped or substantially U-shaped frequency characteristics) such that, when the self-resonance frequency of the capacitor serves as a boundary, the impedance of the capacitor decreases as the frequency increases on the low frequency side of the self-resonance frequency and that the impedance of the capacitor increases as the frequency increases on the high frequency side of the self-resonance frequency. For example, the self-resonance frequency of a capacitor decreases when the electrostatic capacitance of the capacitor increases. The second capacitor 4d has a predetermined self-resonance frequency according to, for example, electrostatic capacitance and has the above-described frequency characteristics with this self-resonance frequency serving as a boundary. The second capacitor 4d having the frequency characteristics does not enable direct current to pass therethrough. In addition, the second capacitor 4d enables a current to pass therethrough in a frequency band in which the impedance of the second capacitor 4d is low (a frequency band in which the second capacitor 4d enables a current to pass therethrough).

Accordingly, after the noise generated by the inductor 10 has reached the shield member 11 and flowed to the first end of the second capacitor 4d via the shield member 11 and the outer electrode 10c, the noise passes through the second capacitor 4d and is grounded through the ground of the substrate 12. In particular, as the frequency of the noise approaches to the self-resonance frequency of the second capacitor 4d, the second capacitor 4d is more likely to enable the noise to pass therethrough, and thus, the noise may easily be grounded. As a result, the noise generated by the inductor 10 is blocked by the shield member 11, and this reduces noise that is emitted beyond the shield member 11. In particular, in the case where the shield member 11 is provided around the periphery of the entire surface of the inductor 10, the noise generated by the inductor 10 can be blocked in all directions, and thus, noise that is emitted to the outside can be reduced the most.

For example, in the case where the DC-DC converter 4 is used in an automobile that is provided with an AM radio, since noise generated by the inductor 10 is blocked by the shield member 11, radio noise can be suppressed. In particular, by using the second capacitor 4d, which has frequency characteristics such that the impedance thereof is low in a frequency band including the frequency band used by the AM radio, the effect of suppressing noise increases.

Figure 4:
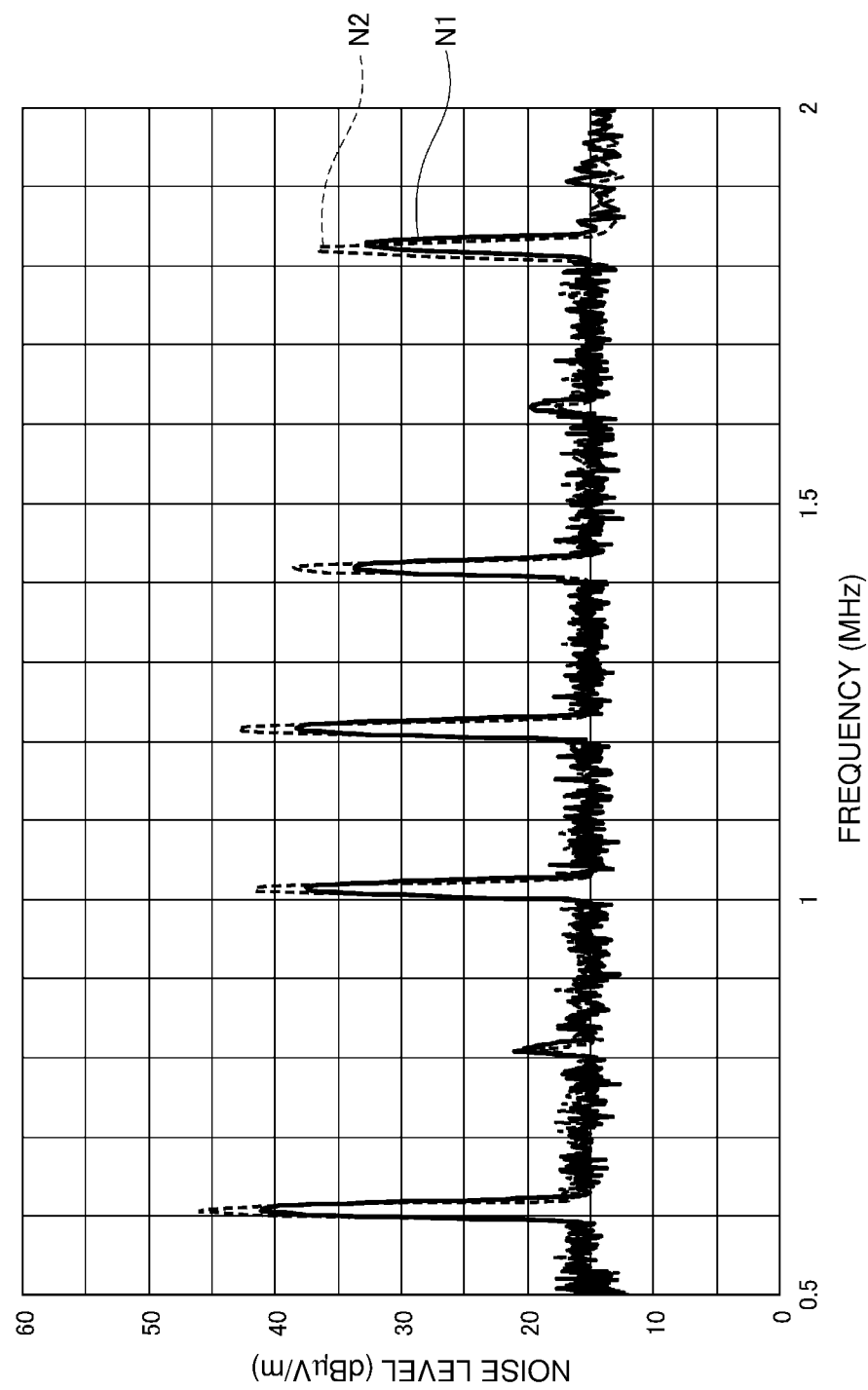
FIG. 4 is a graph illustrating an example of noise levels in a predetermined frequency band in the case where the shield according to the first embodiment is provided and in the case where a shield member is not provided.

The effect of suppressing noise obtained by the shield 1 will be described below with reference to FIG. 4 using a comparative example of noise levels in the case where the inductor 10 of the DC-DC converter 4 is provided with the shield 1 and in the case where a shield member is not provided. FIG. 4 is a graph illustrating an example of noise levels in a predetermined frequency band in the case where the shield 1 according to the first embodiment is provided and in the case where a shield member is not provided. In FIG. 4, the horizontal axis denotes frequency (MHz), and the vertical axis denotes noise level of emission noise (dBμV/m).

The DC-DC converter 4 is a DC-DC converter that steps down a voltage of about 12 V to about 5 V. The switching frequency of the DC-DC converter 4 is about 200 kHz. The frequency band in which emission noise is measured is in a range of about 0.5 MHz to about 2 MHz including the frequency band used by the AM radio. Measurement of the emission noise is performed in accordance with CISPR 25 developed by International Special Committee on Radio Interference. A copper foil film is used as the shield member 11. An insulating film is provided between the shield member 11 and the inductor 10.

In FIG. 4, the noise level in the case where the shield 1 is used is indicated by a solid line N1, and the noise level in the case where a shield member is not provided is indicated by a dashed line N2. When comparing the solid line N1 and the dashed line N2, the noise level in the case where the shield 1 is used is lower than the noise level in the case where a shield member is not provided by about 5 dB at each peak value. It is understood from the comparative example that noise that is emitted to the outside by the inductor 10 can be suppressed by using the shield 1 for the inductor 10.

Figure 5:
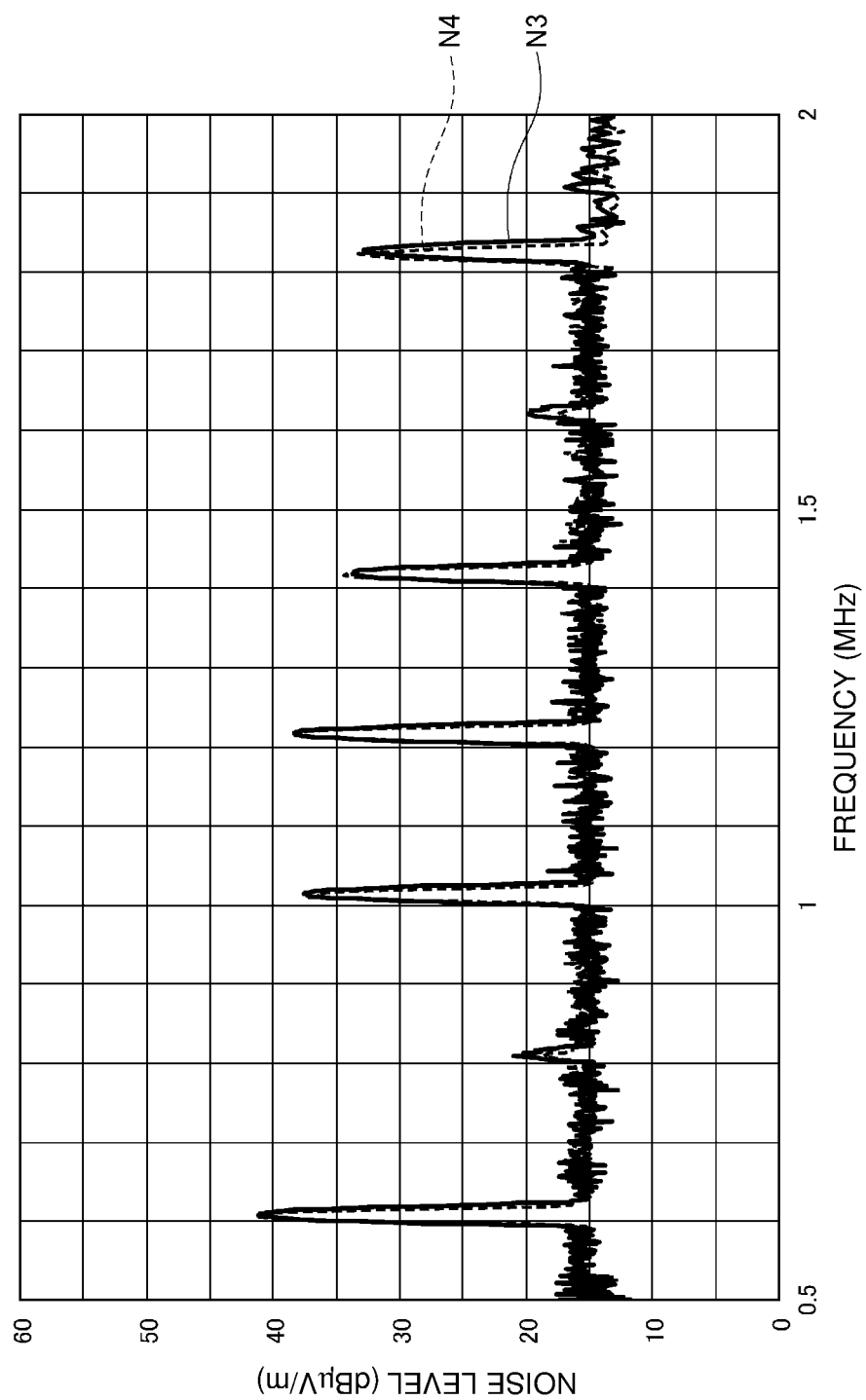
FIG. 5 is a graph illustrating an example of noise levels in a predetermined frequency band in the case where the shield according to the first embodiment is provided and in the case where a shield member connected to a ground is provided.

The effect of suppressing noise obtained by the shield 1 will now be described with reference to FIG. 5 using a comparative example of noise levels in the case where the inductor 10 of the DC-DC converter 4 is provided with the shield 1 and in the case where a shield member grounded to a substrate is used. FIG. 5 is a graph illustrating an example of noise levels in a predetermined frequency band in the case where the shield 1 according to the first embodiment is provided and in the case where the grounded shield member is provided. In FIG. 5, the horizontal axis denotes frequency (MHz), and the vertical axis denotes noise level of emission noise (dBμV/m). The measurement conditions are the same as the conditions in the above-described comparative example illustrated in FIG. 4.

In FIG. 5, the noise level in the case where the shield 1 is used is indicated by a solid line N3, and the noise level in the case where a shield of the related art is used is indicated by a dashed line N4. When comparing the solid line N3 and the dashed line N4, the noise level in the case where the shield 1 is used is approximately the same as the noise level in the case where the shield of the related art is used. It is understood from the comparative example that, by using the shield 1 for the inductor 10, noise that is emitted to the outside by the inductor 10 can be suppressed by an amount approximately corresponding to the amount of noise suppressed by using the shield of the related art that uses a shield member that is grounded of a substrate.

In the shield 1 according to the first embodiment, since the shield member 11 does not need to be grounded, it is not necessary to form a ground pattern to be connected to the shield member 11 in or on the substrate 12, and the effect of suppressing noise emitted by the inductor 10 (shielding effect) can be ensured (provided) by the shield member 11. Since it is not necessary to form a ground pattern for the shield member 11 in or on a surface or an inner layer of the substrate 12, the space that would be used by the ground pattern is free, thereby easing the limitations on pattern layout.

In the shield 1 according to the first embodiment, since the second capacitor 4d has the frequency characteristics such that the closer the self-resonance frequency of the second capacitor 4d, the lower the impedance of the second capacitor 4d, noise can be grounded to the ground of the substrate 12 via the second capacitor 4d by connecting the shield member 11 to the first end of the second capacitor 4d via the outer electrode 10c of the inductor 10.

In the shield 1 according to the first embodiment, in the case where the inductor 10 has a vertically wound structure, by providing the shield member 11 on at least the top surface of the inductor 10, noise generated by the inductor 10 in the vertical direction can be effectively blocked by the shield member 11, and emission of noise to the outside can be suppressed.

In the shield 1 according to the first embodiment, in the case where the inductor 10 has a transversely wound structure, by providing the shield member 11 on at least a pair of side surfaces of the inductor 10, the side surfaces facing each other, noise generated by the inductor 10 in the transverse direction can be effectively blocked by the shield member 11, and emission of noise to the outside can be suppressed.

In the shield 1 according to the first embodiment, by providing the shield member 11 around the periphery of the entire surface of the inductor 10 (five or six surfaces of the inductor 10), noise generated by the inductor 10 in all directions can be blocked by the shield member 11, and the effect of suppressing noise that is emitted to the outside can be improved.

Second Embodiment

Figure 6:
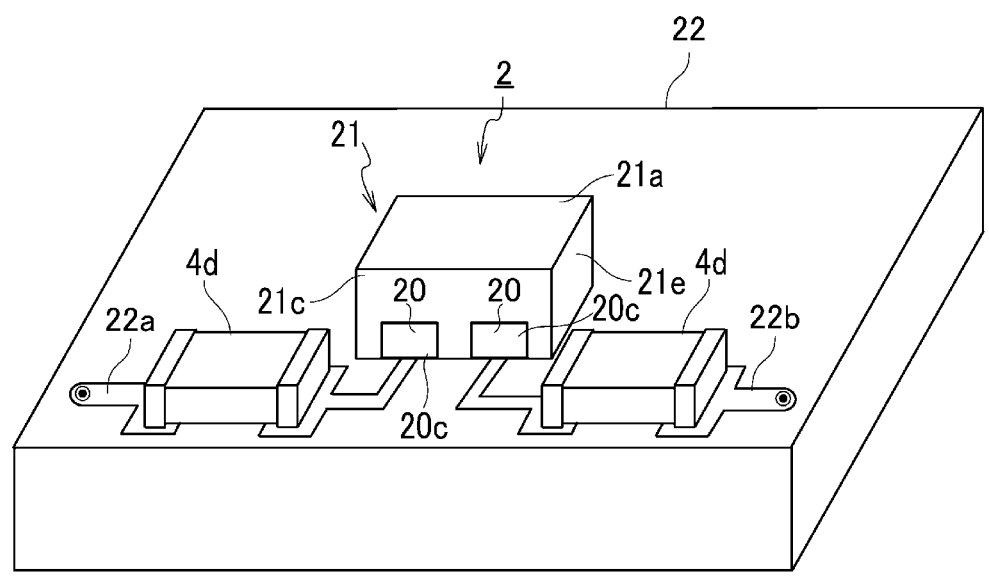
FIG. 6 is a perspective view illustrating a configuration of a shield according to a second embodiment.
Figure 7:
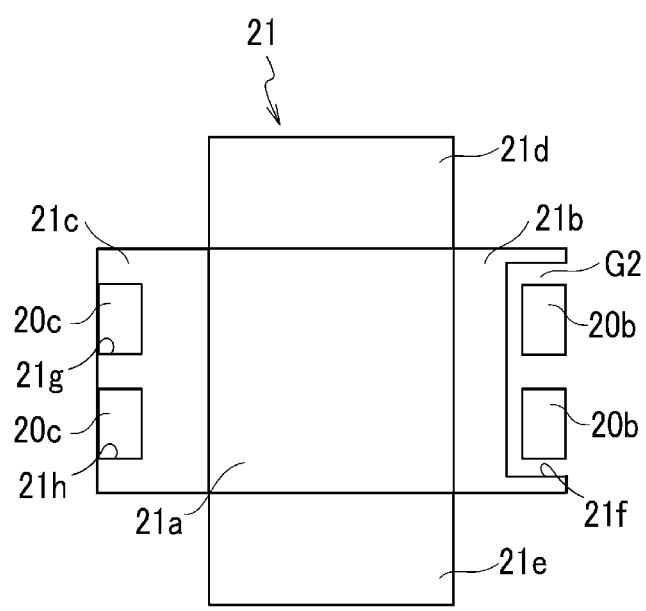
FIG. 7 is a developed view of a shield member used in the shield according to the second embodiment.

A shield 2 according to a second embodiment will now be described with reference to FIG. 6 and FIG. 7. FIG. 6 is a perspective view illustrating the configuration of the shield 2 according to the second embodiment. FIG. 7 is a developed view of a shield member 21 used in the shield 2 according to the second embodiment.

The differences between the shield 2 according to the second embodiment and the shield 1 according to the first embodiment are the number of inductors to be shielded and the shape of a shield member corresponding to the number of the inductors. In the shield 2, the shield member 21 is provided for first and second inductors 20 and 20. In the shield 2, the two inductors 20 and 20 are shielded by a single shield member 21 such that noise emitted by the first and second inductors 20 and 20 are suppressed. In particular, the shield 2 ensures the effect of suppressing noise without connecting the shield member 21 to a ground of a substrate 22. For example, in the case of causing a plurality of power-supply circuits to operate in parallel as in a multiphase power supply, a plurality of (e.g., two) power inductors used in a plurality of (e.g., two) DC-DC converters may sometimes be integrated into one chip. In such a case, the shield 2 can be applied.

Each of the two inductors 20 and 20 has a configuration similar to that of the inductor 10 according to the first embodiment. The two inductors 20 and 20 are arranged in the lateral direction. In the case of the first and second inductors 20 and 20, the first inductor 20 includes a pair of first outer electrodes 20b and 20c, and the second inductor 20 includes a pair of second outer electrodes 20b and 20c. That is to say, the two inductors 20 and 20 include two pairs of outer electrodes 20b and 20c. A surface of the first inductor 20 on which the first outer electrode 20b and a surface of the first inductor 20 on which the first outer electrode 20c face each other. A surface of the second inductor 20 on which the second outer electrode 20b and a surface of the second inductor 20 on which the second outer electrodes 20c face each other.

The first outer electrode 20b and the second outer electrode 20b are arranged in the lateral direction with a predetermined space therebetween. The first outer electrode 20b is electrically connected to a connection point between a switching element 4b and a diode 4c of a first DC-DC converter 4. The second outer electrode 20b is electrically connected to a connection point between a switching element 4b and a diode 4c of a second DC-DC converter 4.

The first outer electrode 20c and the second outer electrode 20c are arranged in the lateral direction with a predetermined space therebetween. The first outer electrode 20c is electrically connected to a first end of an output second capacitor 4d of the first DC-DC converter 4. A second end of the second capacitor 4d is electrically connected to a ground pattern 22a formed in or on a substrate 22 (the second end of the second capacitor 4d is grounded). The second outer electrode 20c is electrically connected to a first end of an output second capacitor 4d of the second DC-DC converter 4. The second end of the second capacitor 4d is electrically connected to a ground pattern 22b formed in or on the substrate 22 (the second end of the second capacitor 4d is grounded).

The shield member 21 is a member that blocks noise generated by the two inductors 20 and 20. The shield member 21 is provided around the periphery of main bodies of the two inductors 20 and 20. In the following description, a case will be described in which the shield member 21 has all the surfaces (five surfaces including a top surface 21a, a pair of side surfaces 21b and 21c facing each other, and a pair of side surfaces 21d and 21e facing each other) as illustrated in FIG. 7.

The side surface 21b of the shield member 21 that is located on the side on which the two outer electrodes 20b and 20b are disposed has a cavity 21f that is formed so as to be larger than the outer electrodes 20b and 20b, which are arranged in the lateral direction, and portions of the side surface 21b except for the cavity 21f include a shield metal. The outer electrodes 20b and 20b are disposed in the cavity 21f. Thus, there is a gap G2 between the outer electrodes 20b and 20b and the side surface 21b of the shield member 21. In contrast, the side surface 21c of the shield member 21 that is located on the side on which the two outer electrodes 20c and 20c are disposed, has a cavity 21g that is formed so as to have a size approximately equal to that of the first outer electrode 20c and a cavity 21h that is formed so as to have a size approximately equal to that of the second outer electrode 20c, and portions of the side surface 21c except for the cavities 21g and 21h include a shield metal. The first outer electrode 20c is disposed in the cavity 21g and electrically connected to the side surface 21c. Thus, the first outer electrode 20c and the shield member 21 are electrically connected to each other. Similarly, the second outer electrode 20c is disposed in the cavity 21h and electrically connected to the side surface 21c. Thus, the second outer electrode 20c and the shield member 21 are electrically connected to each other. Each of the remaining surfaces 21a, 21d, and 21e of the shield member 21 is provided entirely with a shield metal.

The shield 2 according to the second embodiment has advantageous effects similar to those of the shield 1 according to the first embodiment. In particular, the shield 2 according to the second embodiment can be applied to the case of, for example, integrating the two (a plurality of) inductors 20 and 20 into one chip, and noise emitted by the two inductors 20 and 20 can be suppressed by the shield member 21.

Third Embodiment

Figure 8:
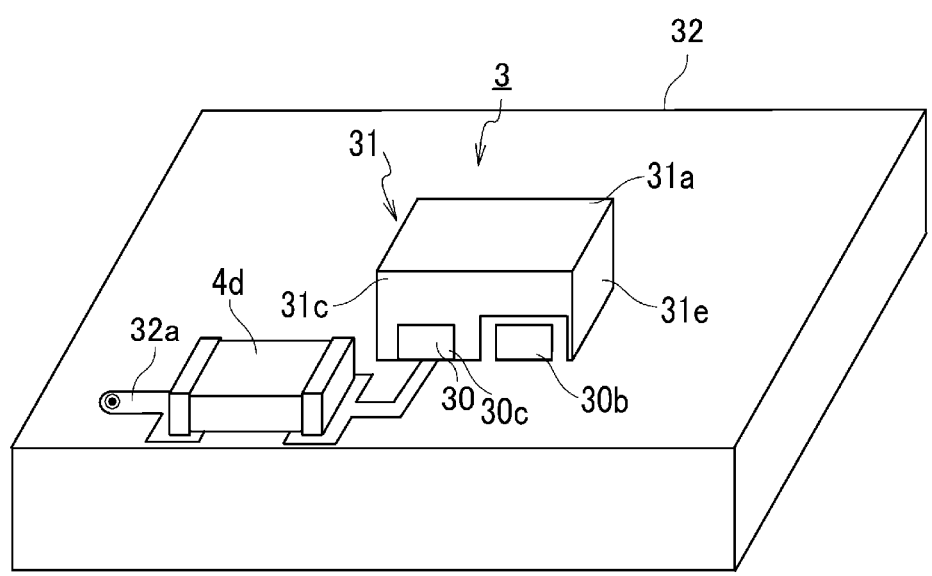
FIG. 8 is a perspective view illustrating a configuration of a shield according to a third embodiment.
Figure 9:
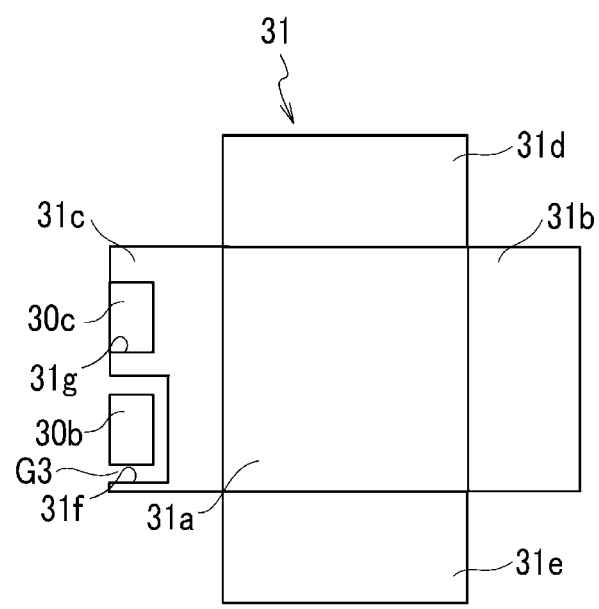
FIG. 9 is a developed view of a shield member used in the shield according to the third embodiment.

A shield 3 according to a third embodiment will now be described with reference to FIG. 8 and FIG. 9. FIG. 8 is a perspective view illustrating the configuration of the shield 3 according to the third embodiment. FIG. 9 is a developed view of a shield member 31 used in the shield 3 according to the third embodiment.

The differences between the shield 3 according to the third embodiment and the shield 1 according to the first embodiment are the arrangement of a pair of outer electrodes and the shape of a shield member corresponding to the arrangement of the pair of outer electrodes. A pair of outer electrodes 30b and 30c are provided on the same surface of an inductor 30. The shield 3 shields the inductor 30 by using the shield member 31 so as to suppress noise emitted by the inductor 30. In particular, the shield 3 ensures an effect of suppressing noise without connecting the shield member 31 to a ground of a substrate 32.

The only difference between the inductor 30 and the inductor 10 according to the first embodiment is that the pair of outer electrodes 30b and 30c are provided on the same surface. The outer electrode 30b and the outer electrode 30c are arranged in the lateral direction with a predetermined space therebetween on the same surface. The outer electrode 30b is electrically connected to a connection point between a switching element 4b and a diode 4c of the DC-DC converter 4. The outer electrode 30c is electrically connected to a first end of a second capacitor 4d of the DC-DC converter 4. A second end of the second capacitor 4d is electrically connected to a ground pattern 32a formed in or on the substrate 32 (the second end of the second capacitor 4d is grounded).

The shield member 31 is a member that blocks noise generated by the inductor 30. The shield member 31 is disposed around the periphery of a main body of the inductor 30. In the following description, a case will be described in which the shield member 31 has all the surfaces (five surfaces including a top surface 31a, a pair of side surfaces 31b and 31c facing each other, and a pair of side surfaces 31d and 31e facing each other) as illustrated in FIG. 9.

The side surface 31c of the shield member 31 that is located on the side on which the outer electrodes 30b and 30c are disposed has a cavity 31f that is formed so as to be larger than the outer electrode 30b and a cavity 31g that is formed so as to have a size approximately equal to that of the outer electrode 30c, and portions of the side surface 31c except for the cavities 31f and 31g include a shield metal. The outer electrode 30b is disposed in the cavity 31f. Thus, there is a gap G3 between the outer electrode 30b and the side surface 31c of the shield member 31. The outer electrode 30c is disposed in the cavity 31g and electrically connected to the side surface 31c. Thus, the outer electrode 30c and the shield member 31 are electrically connected to each other. Each of the remaining surfaces 31a, 31b, 31d, and 31e of the shield member 31 is provided entirely with a shield metal.

The shield 3 according to the third embodiment has advantageous effects similar to those of the shield 1 according to the first embodiment. In particular, the shield 3 according to the third embodiment can also be applied to the case where the outer electrodes 30b and 30c cannot be disposed so as to face each other due to, for example, limitations on the pattern layout in the substrate 32 and the structure of the inductor 30.

Although the embodiments of the present disclosure have been described above, the present disclosure is not limited to the above-described embodiments, and various changes can be made. For example, although the present disclosure has been applied to the shield 1 that shields the inductor 10 of the step-down DC-DC converter 4 used in, for example, an automobile, the present disclosure can also be applied to electronic components, such as a step-up DC-DC converter, an AC-DC converter, and an inverter, that are used in other electronic circuits.

In the above-described embodiments, although the present disclosure is applied to the inductor 10 of the DC-DC converter 4 serving as the first electronic component, the present disclosure may be applied to an electronic component including an electronic element other than an inductor or may be applied to an electronic component including a plurality of electronic elements. An example of the first electronic component is an electronic component in which a first end of a capacitor is connected to an end of an inductor, and in this case, three outer electrodes are provided including an outer electrode that is connected to a first end of a winding of the inductor (the first end of the capacitor), an outer electrode that is connected to a second end of the winding of the inductor, and an outer electrode that is connected to a second end of the capacitor. Another example of the first electronic component other than an inductor of a DC-DC converter is an electronic component that includes a switching element and an inductor, and in this case, four outer electrodes are provided including two outer electrodes connected to the switching element, an outer electrode that is connected to an end of a diode, and an outer electrode that is connected to an end of a winding of the inductor. In this case, noise generated by the inductor and noise generated by the switching element can be suppressed from being emitted to the outside.

In the above-described embodiments, although the present disclosure has been applied to the output second capacitor 4d of the DC-DC converter 4 that serves as the second electronic component, the present disclosure may be applied to an electronic component that includes an electronic element other than a capacitor or may be applied to an electronic component that includes a plurality of electronic elements. An example of the second electronic component is a series resonance circuit in which a capacitor and an inductor are connected in series. In particular, in the above-described embodiments, although the present disclosure is applied to the second capacitor 4d, which serves as the second electronic element and has the frequency characteristics such that the impedance thereof decreases as the frequency increases on the low frequency side of the self-resonance frequency thereof and that the impedance thereof increases as the frequency increases on the high frequency side of the self-resonance frequency thereof, the present disclosure can be applied to a different electronic component as long as the electronic component has at least frequency characteristics such that the impedance thereof decreases at a predetermined frequency.

For example, in the case where the present disclosure is applied to a step-up DC-DC converter, the first electronic component is an electronic component including an inductor and a diode that are connected in series, and the second electronic element is a smoothing capacitor.

In the above-described embodiments, although the present disclosure is applied to the shield members 11, 21, and 31 each having a substantially rectangular parallelepiped shape, the present disclosure may also be applied to a shield member having a different shape, such as a substantially columnar shape.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A shield comprising:
  a first electronic component that is mounted on a substrate in or on which a wiring pattern is formed, the first electronic component including an outer electrode that is connected to the wiring pattern and an other outer electrode;
  a second electronic element that is electrically connected between the other outer electrode of the first electronic component and a ground pattern formed in or on the substrate, and the second electronic element has a frequency characteristic such that an impedance of the second electronic element decreases at a predetermined frequency; and
  a shield member that is disposed on the substrate so as to cover the first electronic component and electrically connected to the other outer electrode of the first electronic component, to which the second electronic element is connected.

2. The shield according to claim 1, wherein the second electronic element has a frequency characteristic such that the impedance of the second electronic element increases at a frequency at which the second electronic element enables an electrical signal to pass through the outer electrode of the first electronic component and that the impedance of the second electronic element decreases at a frequency at which the shield member provides a shielding effect.

3. The shield according to claim 2, wherein the second electronic element has a frequency characteristic such that, when a predetermined frequency serves as a boundary, the impedance of the second electronic element decreases as a frequency increases on a low frequency side of the predetermined frequency and that the impedance of the second electronic element increases as the frequency increases on a high frequency side of the predetermined frequency.

4. An electronic circuit comprising the shield according to claim 2, wherein
  the first electronic component is an inductor; and
  the second electronic element is a capacitor.

5. A DC-DC converter comprising:
  the shield according to claim 2; and
  a switching element;
  wherein the first electronic component is a power inductor that is electrically connected to the switching element, and the second electronic element is a smoothing capacitor that is electrically connected to the power inductor.

6. The shield according to claim 1, wherein the second electronic element has a frequency characteristic such that, when a predetermined frequency serves as a boundary, the impedance of the second electronic element decreases as a frequency increases on a low frequency side of the predetermined frequency and that the impedance of the second electronic element increases as the frequency increases on a high frequency side of the predetermined frequency.

7. An electronic circuit comprising the shield according to claim 6, wherein
  the first electronic component is an inductor; and
  the second electronic element is a capacitor.

8. A DC-DC converter comprising:
  the shield according to claim 6; and
  a switching element;
  wherein the first electronic component is a power inductor that is electrically connected to the switching element, and the second electronic element is a smoothing capacitor that is electrically connected to the power inductor.

9. An electronic circuit comprising the shield according to claim 1, wherein
  the first electronic component is an inductor; and
  the second electronic element is a capacitor.

10. The electronic circuit according to claim 9, wherein the inductor has a vertically wound structure; and
  the shield member is provided on at least a top surface of the inductor.

11. The electronic circuit according to claim 10, wherein the shield member is provided around a periphery of an entire surface of the inductor.

12. The electronic circuit according to claim 9, wherein the inductor has a transversely wound structure; and
  the shield member is provided on at least side surfaces of the inductor that face each other.

13. The electronic circuit according to claim 12, wherein the shield member is provided around a periphery of an entire surface of the inductor.

14. The electronic circuit according to claim 9, wherein the shield member is provided around a periphery of an entire surface of the inductor.

15. A DC-DC converter comprising:
  the shield according to claim 1; and
  a switching element;
  wherein the first electronic component is a power inductor that is electrically connected to the switching element, and the second electronic element is a smoothing capacitor that is electrically connected to the power inductor.

* * * * *